United States Patent
Verdon-Akzam

(10) Patent No.: US 11,669,766 B2
(45) Date of Patent: *Jun. 6, 2023

(54) QUANTUM ANALOG-DIGITAL INTERCONVERSION FOR ENCODING AND DECODING QUANTUM SIGNALS

(71) Applicant: X Development LLC, Mountain View, CA (US)

(72) Inventor: Guillaume Verdon-Akzam, Waterloo (CA)

(73) Assignee: X Development LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/719,356

(22) Filed: Apr. 12, 2022

(65) Prior Publication Data

US 2022/0237492 A1     Jul. 28, 2022

Related U.S. Application Data

(63) Continuation of application No. 17/063,595, filed on Oct. 5, 2020, now Pat. No. 11,308,415.

(60) Provisional application No. 62/911,055, filed on Oct. 4, 2019.

(51) Int. Cl.
| | |
|---|---|
| H03M 1/66 | (2006.01) |
| G06N 10/00 | (2022.01) |
| G06F 17/14 | (2006.01) |
| H03M 1/12 | (2006.01) |

(52) U.S. Cl.
CPC ............ G06N 10/00 (2019.01); G06F 17/14 (2013.01); H03M 1/1245 (2013.01); H03M 1/66 (2013.01)

(58) Field of Classification Search
CPC ..................................................... G06N 10/00
USPC ................................................... 341/155, 144
See application file for complete search history.

(56) References Cited

U.S. PATENT DOCUMENTS

| | | | |
|---|---|---|---|
| 11,308,415 B2 * | 4/2022 | Verdon-Akzam ... | H03M 1/1245 |
| 2017/0286858 A1 | 10/2017 | La Cour et al. | |
| 2019/0049495 A1 | 2/2019 | Ofek et al. | |
| 2021/0103847 A1 | 4/2021 | Verdon-Akzam | |
| 2021/0103849 A1 | 4/2021 | Verdon-Akzam | |

FOREIGN PATENT DOCUMENTS

WO     WO 2019/156760     8/2019

OTHER PUBLICATIONS

Bergmann et al., "Hybrid quantum repeater for qudits," Physical Review A, Mar. 2019, 99(3):032349.
Fluhmann et al., "Encoding a qubit in a trapped-ion mechanical oscillator," Nature, Feb. 2019, 566:513-517.
Forsch et al., "Microwave-to-optics conversion using a mechanical oscillator in its quantum ground state," Nature Physics, Oct. 2019, 16:69-74.

(Continued)

*Primary Examiner* — Peguy Jean Pierre
(74) *Attorney, Agent, or Firm* — Fish & Richardson P.C.

(57) ABSTRACT

Methods, systems, and apparatus for quantum analog-digital conversion. In one aspect, a method includes obtaining a quantum analog signal; applying a hybrid analog-digital encoding operation to the quantum analog signal and a qudit in an initial state to obtain an evolved state of the qudit, wherein the hybrid analog-digital encoding operation is based on a swap operation comprising multiple adder operations; and providing the qudit in the evolved state as a quantum digital encoding of the quantum analog signal.

20 Claims, 4 Drawing Sheets

(56) References Cited

OTHER PUBLICATIONS

Gottesman et al., "Encoding a qubit in an oscillator," CoRR, Aug. 2000, arxiv.org/abs/quant-ph/0008040, 22 pages.
Macridin et al., "Digital quantum computation of fermion-boson interacting systems," CoRR, May 2018, arxiv.org/abs/1805.09928, 20 pages.
Mitarai et al., "Quantum Analog-Digital Conversion," CoRR, May 2018, arxiv.org/abs/1805.11250, 9 pages.
PCT International Search Report and Written Opinion in International Appln. No. PCT/US20/54309, dated Feb. 1, 2021, 8 pages.
PCT International Search Report and Written Opinion in International Appln. No. PCT/US2020054301, dated Feb. 16, 2021, 16 pages.
PCT International Search Report and Written Opinion in International Appln. No. PCT/US2020054305, dated Feb. 9, 2021, 27 pages.
Rueda et al., "Efficient microwave to optical photon conversion; an electro-optical realization," Optica, Jun. 2016, 3(6):597-604.
Shi et al., "Fault-tolerant preparation of approximate GKP states," New J. Phys., 2019, 21:093007.
Terhal et al., "Encoding a qubit into a cavity mode in circuit QED using phase estimation," Physical Review, Jan. 2016, 93:012315.
Verdon et al., "A Universal Training Algorithm for Quantum Deep Learning," CoRR, Jun. 2018, arxiv.org/abs/1806.09729, 83 pages.
Verdon-Akzam, "Probing Quantum Fields: Measmements and Quantum Energy Teleportation," Thesis for the degree of Master of Mathematics in Applied Mathematics (Quantum Information), University of Waterloo, Ontario Canada, 2017, 181 pages.

\* cited by examiner

QUANTUM ANALOG-DIGITAL INTERCONVERSION FOR ENCODING AND DECODING QUANTUM SIGNALS

CROSS REFERENCE TO RELATED APPLICATIONS

This application is a continuation of U.S. application Ser. No. 17/063,595 filed Oct. 5, 2020, which claims the benefit, under 35 U.S.C. § 119(e), of U.S. Provisional Application Ser. No. 62/911,055, filed on Oct. 4, 2019. The disclosure of the prior applications are considered part of this application and are hereby incorporated by reference in their entirety.

TECHNICAL FIELD

This specification relates to signal processing, including systems for quantum digital signal processing.

BACKGROUND

Quantum information includes any type of information carried by a quantum system. Quantum information can include quantum digital information and quantum analog information.

The most basic unit of quantum digital information is the qubit. A qubit is a two-level quantum-mechanical system. In a classical system, a bit would have to be in one level or the other. However, quantum mechanics allows a qubit to be in a coherent superposition of both levels, a property which is fundamental to quantum mechanics and quantum computing. Qudits are the generalization of qubits to arbitrary numbers of discrete quantum mechanical levels.

Quantum analog information is carried by continuous-variable quantum systems, e.g., quantum fields.

SUMMARY

This specification describes techniques for quantum analog-digital interconversion of quantum signals.

In general, one innovative aspect of the subject matter described in this specification can be embodied in a method for quantum analog-digital conversion, the method comprising: obtaining a quantum analog signal; applying a hybrid analog-digital encoding operation to the quantum analog signal and a qudit in an initial state to obtain an evolved state of the qudit, wherein the hybrid analog-digital encoding operation is based on a swap operation comprising multiple adder operations; and providing the qudit in the evolved state as a quantum digital encoding of the received quantum analog signal.

Other embodiments of this aspect include corresponding classical and quantum computer and communication systems, apparatus, and computer programs recorded on one or more computer storage devices, each configured to perform the actions of the methods. A system of one or more classical and quantum computers and/or communication systems can be configured to perform particular operations or actions by virtue of software, firmware, hardware, or any combination thereof installed on the system that in operation can cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the multiple adder operations comprise three adder operations.

In some implementations the swap operation comprises multiple Quantum Fourier transformations.

In some implementations the swap operation comprises: a first adder operation applied to a first signal and a second signal; two sequential Fourier transformations applied to the second signal; a second adder operation applied to the first signal and the second signal; two sequential Fourier transformations applied to the first signal; a third adder operation applied to the first signal and the second signal; and two sequential Fourier transformations applied to the second signal.

In some implementations the first signal comprises a first quantum analog signal, the second signal comprises a second quantum analog signal, and the swap operation comprises an analog swap operation that swaps information stored in the first quantum analog signal and the second quantum analog signal.

In some implementations the first adder operation and the third adder operation represent a unitary transformation comprising a canonical field position operator for the first quantum analog signal and a canonical field momentum operator for the second quantum analog signal; and the second adder operation represents a unitary transformation comprising a canonical field momentum operator for the first quantum analog signal and a canonical field position operator for the second quantum analog signal.

In some implementations the first signal comprises a first quantum digital signal, the second signal comprises a second quantum digital signal, and the swap operation comprises a digital swap operation that swaps information stored in the first quantum digital signal and the second quantum digital signal.

In some implementations the first adder operation, the second adder operation and the third adder operation represent a unitary transformation comprising a first qudit clock operator generator for the first quantum digital signal and a second qudit clock operator generator for the second quantum digital signal.

In some implementations the hybrid analog-digital encoding operation comprises: a first unitary transformation comprising a canonical field momentum operator and a qudit field operator; multiple Fourier transformations; and a second unitary transformation comprising a canonical field position operator and the qudit field operator.

In some implementations applying the hybrid analog-digital encoding operation to the quantum analog signal and a qudit in an initial state, comprises: applying the first unitary transformation to the quantum analog signal and the initial state of the qudit to obtain a first modified quantum analog signal and a first evolved state of the qudit; sequentially applying two Fourier transformations to the first modified quantum analog signal to obtain a second modified quantum analog signal; applying a Fourier transformation to the first evolved state of the qudit to obtain a second evolved state of the qudit; applying the second unitary transformation to the second modified quantum analog signal and the second evolved state of the qudit to obtain a third modified quantum analog signal and a third evolved state of the qudit; applying a Fourier transformation to the third evolved state of the qudit to obtain a fourth evolved state of the qudit; and applying the first unitary transformation to the third modified quantum analog signal and the fourth evolved state of the qudit to obtain a fifth evolved state of the qudit, wherein providing the qudit in the evolved state as a quantum digital encoding of the quantum analog signal comprises providing the qudit in the fifth evolved state as a quantum digital encoding of the quantum analog signal.

In some implementations applying the first unitary transformation to the third modified quantum analog signal and the fourth evolved state of the qudit produces a fourth modified quantum analog signal, and wherein the method further comprises sequentially applying two Fourier transformations to the fourth modified quantum analog signal.

In some implementations the hybrid analog-digital encoding operation is equivalent to the swap operation.

In some implementations the quantum analog signal comprises a quantum mode of a quantum field and a quantum mode amplitude sampled from an interval of space, frequency, or a general window function profile of the quantum field.

In some implementations the method further comprises sampling the quantum mode and quantum mode amplitude of the quantum field using a resonator coupled to the quantum field; and storing the sampled quantum mode and quantum mode amplitude in an analog register, optionally wherein the resonator coupled to the quantum field comprises the analog register.

In some implementations sampling the quantum mode and quantum mode amplitude of the quantum field using a resonator coupled to the quantum field comprises swapping quantum information from the quantum analog signal onto a quantum mode through application of an analog swap operation to the quantum analog signal and the quantum mode.

In some implementations application of the analog swap operation to the quantum analog signal and the quantum mode comprises evolving the quantum analog signal and the quantum mode under photon exchange interaction.

In some implementations the quantum mode amplitude comprises an average field amplitude value determined according to a predetermined window function and a quantum field operator corresponding to the quantum field.

In some implementations the predetermined window function comprises a wavelet.

In some implementations the qudit comprises a $d=2^N$ dimensional quantum register represented by N qubits.

In some implementations applying the first unitary transformation or second unitary transformation to respective states of the qudit comprises applying corresponding qubit transformations to respective states of the N qubits.

In some implementations the qudit field operator is given by a linear combination of qudit clock operator generators and identity operators.

In some implementations the qudit clock operator generators are given by $$\hat{J}_{d=2^N} = \sum_{n=1}^{N} 2^{n-2} \left( \hat{I}_2^{(n)} - Z_2^{(n)} \right)$$

where $\hat{I}_2^{(n)}$ represents a 2×2 identity operator acting on qubit n and $Z_2^{(n)}$ represents a Pauli Z operator acting on qubit n.

In some implementations the qudit field operator is given by $$\Phi_d = \frac{(b-a)}{(d-1)} \hat{J}_d + a \hat{I}_d$$

where $\hat{I}_d$ represents a d×d identity operator and [a, b] represents a quantum analog sampling interval.

In some implementations the method further comprises selecting N based on a predetermined target encoding precision.

In some implementations providing the qudit in the fifth evolved state as the quantum digital encoding of the quantum analog signal comprises discarding one or more of the N qubits to reduce the resolution of the quantum digital encoding of the quantum analog signal.

In some implementations the method further comprises storing the quantum digital encoding of the quantum analog signal in quantum memory.

In some implementations the method further comprises receiving multiple quantum analog signals, wherein each of the multiple quantum analog signals comprises a respective quantum mode of a same quantum field and a respective quantum mode amplitude sampled from an interval of the quantum field; applying, for each received quantum analog signal, the hybrid analog-digital encoding operation to the quantum analog signal and a qudit in an initial state; and providing, for each received quantum analog signal, a respective qudit in an evolved state as a quantum digital encoding of the quantum analog signal.

In some implementations the provided quantum digital encodings of the received multiple quantum analog signals comprise a quantum digital encoding of the quantum field.

In some implementations the respective quantum modes of the same quantum field form a basis.

In some implementations the multiple quantum analog signals comprise quantum analog signals comprising a same quantum mode and respective quantum mode amplitudes sampled from different intervals of the quantum field.

In some implementations the method further comprises sequentially sampling and applying the hybrid analog-digital encoding operation to each quantum analog signal, wherein a hold operation is applied to analog quantum modes in memory during application of each hybrid analog-digital encoding operation.

In general, another innovative aspect of the subject matter described in this specification can be embodied in a method for quantum digital-analog conversion, the method comprising: obtaining a qudit, wherein the qudit stores quantum digital information; applying a hybrid digital-analog swap operation to the qudit and a quantum analog register in an initial state to obtain a modified state of the quantum analog register, wherein the hybrid digital-analog swap operation is based on a swap operation comprising multiple adder operations; and providing the modified state of the quantum analog register as a quantum analog encoding of the quantum digital information.

Other embodiments of this aspect include corresponding classical and quantum computer and communication systems, apparatus, and computer programs recorded on one or more computer storage devices, each configured to perform the actions of the methods. A system of one or more classical and quantum computers and/or communication systems can be configured to perform particular operations or actions by virtue of software, firmware, hardware, or any combination thereof installed on the system that in operation can cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the multiple adder operations comprise three adder operations.

In some implementations the swap operation comprises multiple Quantum Fourier transformations.

In some implementations the swap operation comprises: a first adder operation applied to a first signal and a second signal; two sequential Fourier transformations applied to the second signal; a second adder operation applied to the first signal and the second signal; two sequential Fourier transformations applied to the first signal; a third adder operation applied to the first signal and the second signal; and two sequential Fourier transformations applied to the second signal.

In some implementations the first signal comprises a first quantum analog signal, the second signal comprises a second quantum analog signal, and the swap operation comprises an analog swap operation that swaps information stored in the first quantum analog signal and the second quantum analog signal.

In some implementations the first adder operation and the third adder operation represent a unitary transformation comprising a canonical field position operator for the first quantum analog signal and a canonical field momentum operator for the second quantum analog signal; and the second adder operation represents a unitary transformation comprising a canonical field momentum operator for the first quantum analog signal and a canonical field position operator for the second quantum analog signal.

In some implementations the first signal comprises a first quantum digital signal, the second signal comprises a second quantum digital signal, and the swap operation comprises a digital swap operation that swaps information stored in the first quantum digital signal and the second quantum digital signal.

In some implementations the first adder operation, the second adder operation and the third adder operation represent a unitary transformation comprising a first qudit clock operator generator for the first quantum digital signal and a second qudit clock operator generator for the second quantum digital signal.

In some implementations the hybrid digital-analog swap operation comprises: a first unitary transformation comprising a canonical field momentum operator and a qudit field operator; multiple Fourier transformations; and a second unitary transformation comprising a canonical field position operator and the qudit field operator.

In some implementations applying the hybrid digital-analog swap operation to the qudit and a quantum analog register in an initial state to obtain a modified state of the quantum analog register comprises sequentially applying two Fourier transformations to the quantum analog register in the initial state to obtain a first modified state of the quantum analog register; applying a first unitary transformation to the first modified state of the quantum analog register and the qudit to obtain a second modified state of the quantum analog register and a first evolved state of the qudit, wherein the first unitary transformation comprises a canonical field momentum operator and a qudit field operator; applying a Fourier transformation to the first evolved state of the qudit to obtain a second evolved state of the qudit; applying a second unitary transformation to the second modified state of the quantum analog register and the second evolved state of the qudit to obtain a third modified state of the quantum analog register and a third evolved state of the qudit, wherein the second unitary transformation comprises a canonical field position operator and the qudit field operator; applying a Fourier transformation to the third evolved state of the qudit to obtain a fourth evolved state of the qudit; sequentially applying two Fourier transformations to the third modified state of the quantum analog register to obtain a fourth modified state of the quantum analog register; and applying the first unitary transformation to the fourth modified state of the quantum analog register and the fourth evolved state of the qudit to obtain a fifth modified state of the quantum analog register, wherein providing the modified state of the quantum analog register as a quantum analog encoding of the quantum digital information comprises providing the fifth modified state of the quantum analog register as the quantum analog encoding of the quantum digital information.

In some implementations the hybrid digital-analog swap operation is equivalent to the analog swap operation.

In some implementations the initial state comprises one or more quantum modes.

In some implementations the initial state comprises a vacuum state or a thermal state.

In some implementations the qudit comprises a $d=2^N$ dimensional quantum register represented by N qubits.

In some implementations applying the first unitary transformation or second unitary transformation to respective states of the qudit comprises applying corresponding qubit transformations to respective states of the N qubits.

In some implementations the qudit field operator is given by a linear combination of qudit clock operator generators and identity operators.

In some implementations the qudit clock operator generators are given by $$\hat{J}_{d=2^N} = \sum_{n=1}^{N} 2^{n-2}\left(\hat{I}_2^{(n)} - \hat{Z}_2^{(n)}\right)$$

where $\hat{I}_2^{(n)}$ represents a 2×2 identity operator acting on qubit n and $\hat{Z}_2^{(n)}$ represents a Pauli Z operator acting on qubit n.

In some implementations the qudit field operator is given by $$\hat{\Phi}_d = \frac{(b-a)}{(d-1)}\hat{J}_d + a\hat{I}_d$$

where $\hat{I}_d$ represents a d×d identity operator and [a, b] represents a quantum analog sampling interval.

In some implementations the method further comprises selecting N based on a predetermined target encoding precision.

In some implementations the N qubits comprise one or more qubits added to increase the resolution of the quantum analog encoding of the quantum digital information.

In some implementations the method further comprises receiving multiple qudits, wherein each qudit stores respective quantum digital information; applying, for each received qudit, the hybrid digital-analog swap operation to the quantum analog register in the initial state and the qudit; and providing, for each qudit, a respective modified state of the quantum analog register as a quantum analog encoding of the respective quantum digital information.

In some implementations the provided modified states of the quantum analog register form a quantum field encoding of the quantum digital information stored by the multiple qudits.

The details of one or more implementations of the subject matter of this specification are set forth in the accompanying drawings and the description below. Other features, aspects, and advantages of the subject matter will become apparent from the description, the drawings, and the claims.

DETAILED DESCRIPTION

This specification describes systems and methods for quantum analog-digital interconversion of quantum signals via application of a hybrid quantum analog-digital interconversion operation.

The hybrid quantum analog-digital interconversion operation is a reversible, multi-step process. In a first step, quantum information from a quantum analog signal is swapped onto a quantum mode, e.g., a continuous-variable quantum analog on-chip degree of freedom/memory such as a quantum harmonic oscillator, via an analog swapping interaction between the quantum mode and the quantum analog signal. The analog swapping interaction involves coupling the two quantum degrees of freedom via a form of controllable coupling, and converts a given sample contained in the flying memory, e.g., an electromagnetic signal moving at the speed of light, onto a stationary quantum analog memory element on chip.

In a second step, quantum information is swapped between the stationary quantum mode and a set of qubits representing a qudit via application of the hybrid quantum analog-digital interconversion operation. The qudit then obtains an approximate quantum digital representation of the quantum information contained in the quantum mode. A tradeoff between the dynamic range (range between min and max values of signal) versus the precision (increment) of this representation is dependent on the number of qubits used to represent the qudit—potential position (amplitude) and momentum (conjugate to amplitude) values can be tuned to tradeoff position vs momentum precision/accuracy according to the Heisenberg uncertainty principle.

Figure 1:
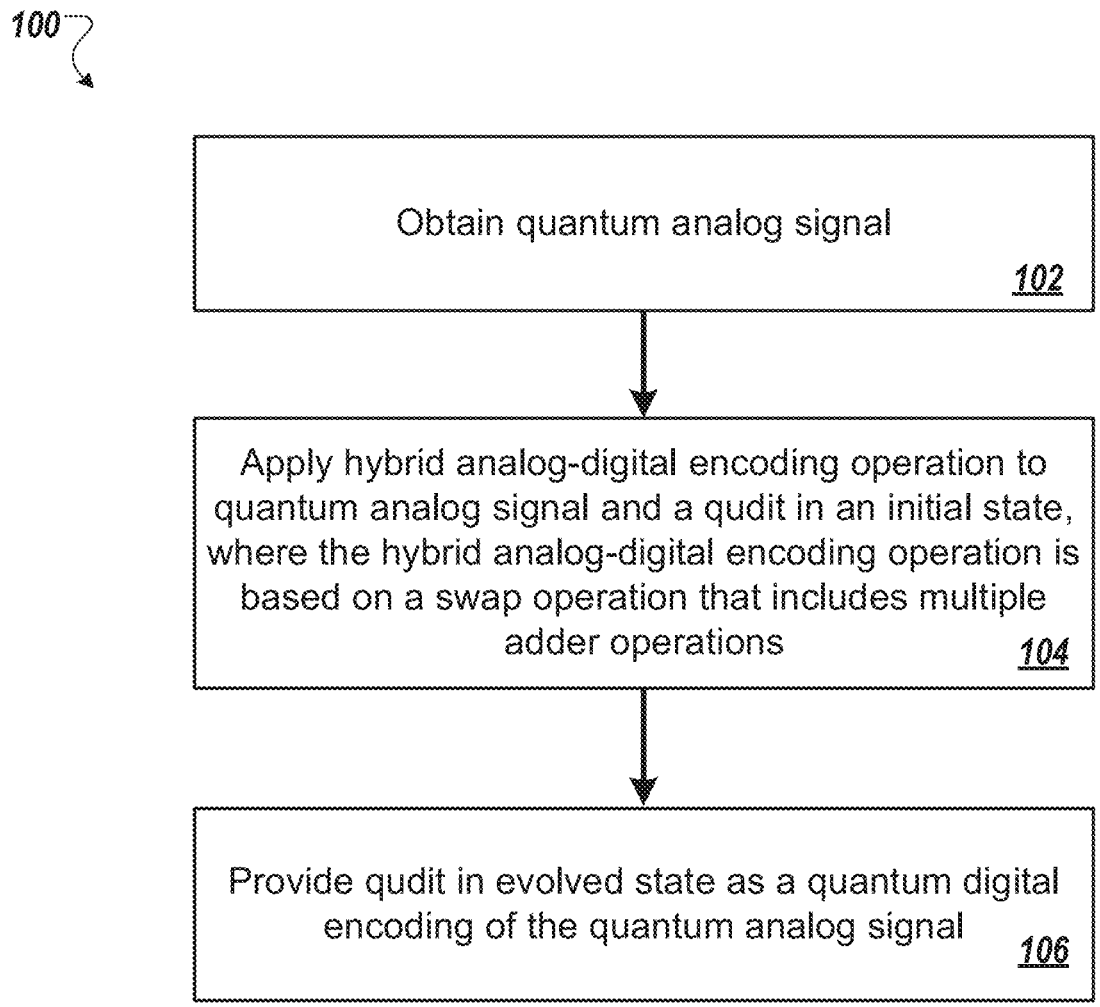
FIG. 1 is a flow diagram of an example process for generating a quantum digital encoding of a quantum analog signal.

FIG. 1 is a flow diagram of an example process 100 for generating a quantum digital encoding of a quantum analog signal. For convenience, the process 100 will be described as being performed by a system of one or more classical and quantum computing devices located in one or more locations.

The system obtains a quantum analog signal (step 102). The quantum analog signal can include a quantum mode of a quantum field and a quantum mode amplitude sampled from an interval of space, frequency, or a general window function profile of the quantum field. In some implementations the quantum mode amplitude can be an average field amplitude value determined according to a predetermined window function, e.g., a wavelet, and a quantum field operator corresponding to the quantum field.

In some implementations the system can obtain the quantum analog signal by sampling the quantum mode and quantum mode amplitude of the quantum field, e.g., using a resonator coupled to the quantum field. In these implementations the system can store the sampled quantum mode and quantum mode amplitude in an analog register, e.g., in the resonator coupled to the quantum field.

To sample the quantum mode and quantum mode amplitude of the quantum field, the system can transfer quantum information from the quantum field onto a quantum mode (a continuous-variable quantum analog degree of freedom or memory, e.g. a quantum harmonic oscillator) through application of an analog swap operation to the quantum analog signal and the quantum mode. This can include coupling the two quantum degrees of freedom via a form of controllable coupling in order to convert a given sample contained in the "flying" memory (e.g. electromagnetic signal moving at the speed of light) onto a stationary quantum analog memory element, e.g., on a chip. The analog swap operation can be applied by implementing a unitary operator $$\hat{U}_{jk} = e^{i\frac{\pi}{2}(\hat{a}_j^\dagger \hat{a}_k + \hat{a}_j \hat{a}_k^\dagger)}$$

where $\hat{\alpha}_k$ and $\hat{\alpha}_j$ represent photon annihilation operators of the k-th and j-th quantum mode respectively. In some implementations the index j can label a sample subspace of the quantum field, and the index k can label the stationary quantum mode on the chip. This unitary swap is the result of an evolution under photon exchange interaction, commonly occurring in beam splitters in optical systems, or whenever two bosonic quantum modes are in resonance with one another (i.e. strongly coupled).

The system applies a hybrid analog-digital encoding operation to the quantum analog signal and a qudit in an initial state to obtain an evolved state of the qudit (step 104). The qudit includes a $d=2^N$ dimensional quantum register represented by N qubits, where N is selected based on a predetermined target encoding precision. The qudit can be prepared in an arbitrary initial state. During the process 100 the state of the qudit will be transferred to the quantum analog signal, which enables simultaneous emission and receiving of quantum information. In the case of example process 100, the quantum analog signal is being encoded as quantum digital information and therefore the transfer of the initial state of the qudit to the quantum analog signal is not of primary importance. However, for certain initial qudit states, some operations of the example process 100 can be eliminated. For example, if the qudit is prepared in a |0>state, a first adder operation in the swap operation described below can be omitted since applying an adder operation to the |0>state leaves the system invariant and thus the operation can be omitted.

The hybrid analog-digital encoding operation is based on a swap operation that operates on two signals—a first signal and a second signal—and includes multiple adder operations. In some implementations the multiple adder operations can include three adder operations. The swap operation can also include multiple quantum Fourier transformations. For example, the swap operation can include a first adder operation applied to a first signal and a second signal, two sequential Fourier transformations applied to the second signal, a second adder operation applied to the first signal and the second signal, two sequential Fourier transformations applied to the first signal, a third adder operation applied to the first signal and the second signal, and two sequential Fourier transformations applied to the second signal.

The swap operation can be an analog swap operation that operates on a first quantum analog signal and a second quantum analog signal and swaps information stored in the first quantum analog signal and the second quantum analog signal. In this case the above described first adder operation and third adder operation represent a unitary transformation $U_1=e^{i\hat{\phi}_1\hat{\pi}_2}$ that includes a canonical field position operator $\hat{\phi}_1$ for the first quantum analog signal and a canonical field momentum operator $\hat{\pi}_2$ for the second quantum analog signal. The second adder operation represents a unitary transformation $U_2=e^{i\hat{\pi}_1\hat{\phi}_2}$ comprising a canonical field momentum operator $\hat{\pi}_1$ for the first quantum analog signal and a canonical field position operator $\hat{\phi}_2$ for the second quantum analog signal. However, in practice, a more efficient implementation of an analog swap operation can be achieved through evolution under photon exchange interaction, as described above.

Alternatively, the swap operation can be a digital swap operation that operates on a first quantum digital signal and a second quantum digital signal and swaps information stored in the first quantum digital signal and the second quantum digital signal. In this case the above described first adder operation, second adder operation and third adder operation represent a unitary transformation $U=e^{iJ_1J_2}$ that includes a first qudit clock operator generator $\hat{J}_1$ for the first quantum digital signal and a second qudit clock operator generator $\hat{J}_2$ for the second quantum digital signal.

Figure 2:
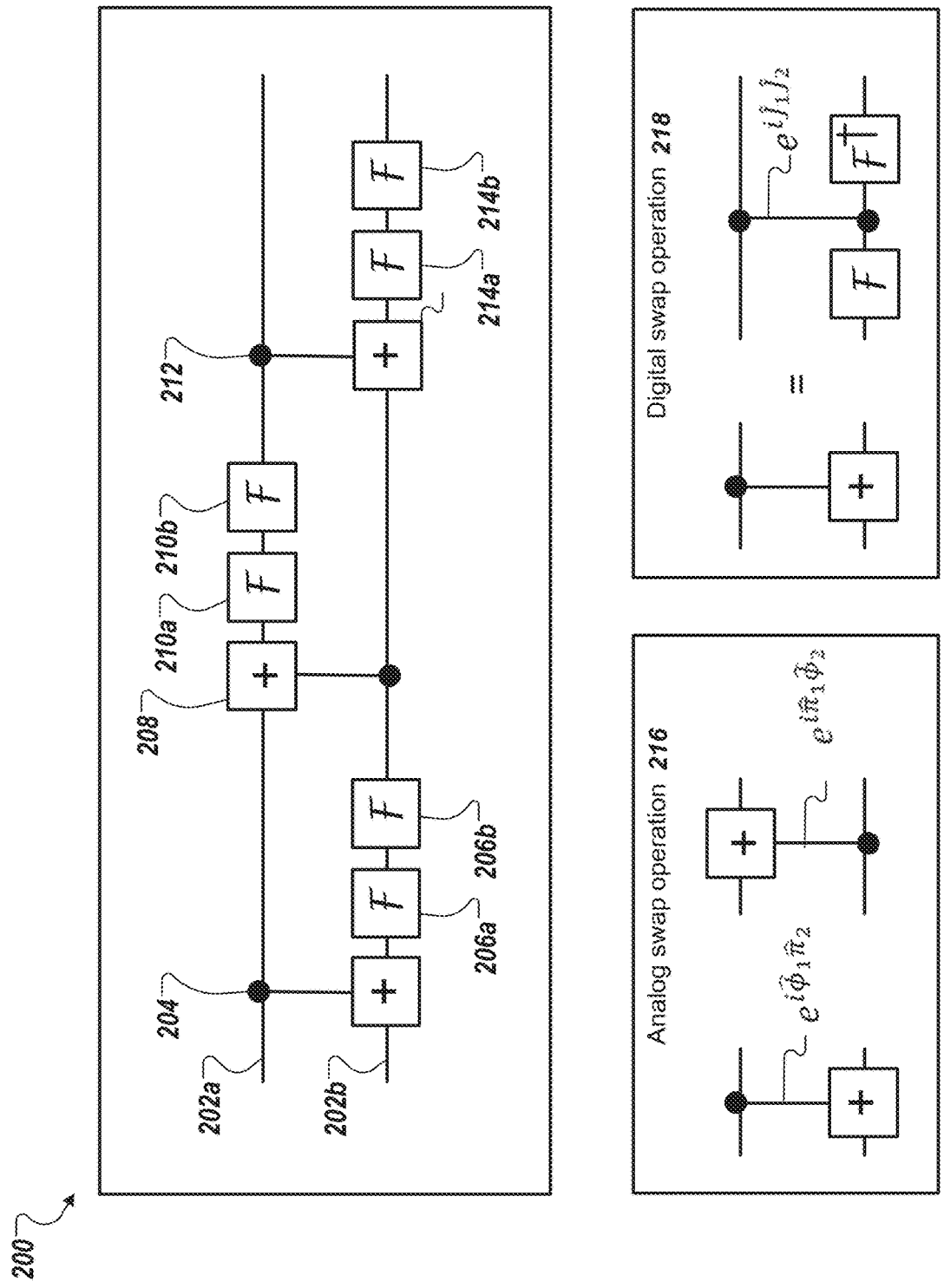
FIG. 2 shows an example swap operation.

FIG. 2 shows an example swap operation 200 applied to a first signal 202a and a second signal 202b. As described above, the first signal 202a and second signal 202b can both be quantum analog signals or both be quantum digital signals. If the first signal 202a and second signal 202b are quantum analog signals, the adder operations 204, 208 and 212 represent the unitary transformations given in the legend 216. If the first signal 202a and second signal 202b are quantum digital signals, the adder operations 204, 208 and 212 represent the unitary transformations given in the legend 218.

During application of the example swap operation 200, a first adder operation 204 is applied to the first signal 202a and the second signal 202b. Two quantum Fourier transformations 206a, 206b are then sequentially applied to the second signal 202b. In practical implementations, sequential application of two quantum Fourier transforms to an analog quantum signal can be achieved through a single operation that includes application of a pi pulse to the analog quantum signal, e.g. $\hat{U}=F_j^2=e^{i\pi(\hat{\alpha}_j^\dagger\hat{\alpha}_j)}$. Application of the pi pulse represents an evolution under a quantum harmonic oscillator Hamiltonian for an angle (i.e., time multiplied by angular frequency) π.

A second adder operation 208 is then applied to the first signal 202a and the second signal 202b. Two quantum Fourier transformations 210a, 210b are then sequentially applied to the first signal 202a. Again, in practical implementations sequential application of the two quantum Fourier transforms can be achieved through application of a pi pulse to the first signal 202a.

A third adder operation 212 is then applied to the first signal 202a and the second signal 202b. The third adder operation is the same as the first adder operation 204. Two quantum Fourier transformations 214a, 214b are then sequentially applied to the second signal 202b. Again, in practical implementations sequential application of the two quantum Fourier transforms can be achieved through application of a pi pulse to the second analog quantum signal 202b.

Returning to FIG. 1, the hybrid analog-digital encoding operation that is based on the above described swap operation includes a first unitary transformation that includes a canonical field momentum operator and a qudit field operator. The qudit field operator is given by a linear combination of qudit clock operator generators $$\hat{J}_{d=2^N} = \sum_{n=1}^{N} 2^{n-2}\left(\hat{I}_2^{(n)} - Z_2^{(n)}\right),$$

where $\hat{I}_2^{(n)}$ represents a 2×2 identity operator acting on qubit n and $Z_2^{(n)}$ represents a Pauli Z operator acting on qubit n, and identity operators. For example, the qudit field operator can be given by $$\Phi_d = \frac{(b-a)}{(d-1)}\hat{J}_d + a\hat{I}_d$$

where $\hat{I}_d$ represents a d×d identity operator and [a, b] represents a quantum analog sampling interval where a and b are tunable parameters which can be tuned to sample from different values of position.

The hybrid analog-digital encoding operation also includes multiple quantum Fourier transformations, and a second unitary transformation that includes a canonical field position operator and the qudit field operator. Because the qudit includes a $d=2^N$ dimensional quantum register represented by N qubits, applications of the first unitary transformation and the second unitary transformation to states of the qudit involves applying corresponding qubit transformations to respective states of the N qubits.

The hybrid analog-digital encoding operation is approximately equivalent to the swap operation, e.g., up to a given fidelity, precision and/or range limits determined by the dimension of the qudit (number of qubits).

Figure 3:
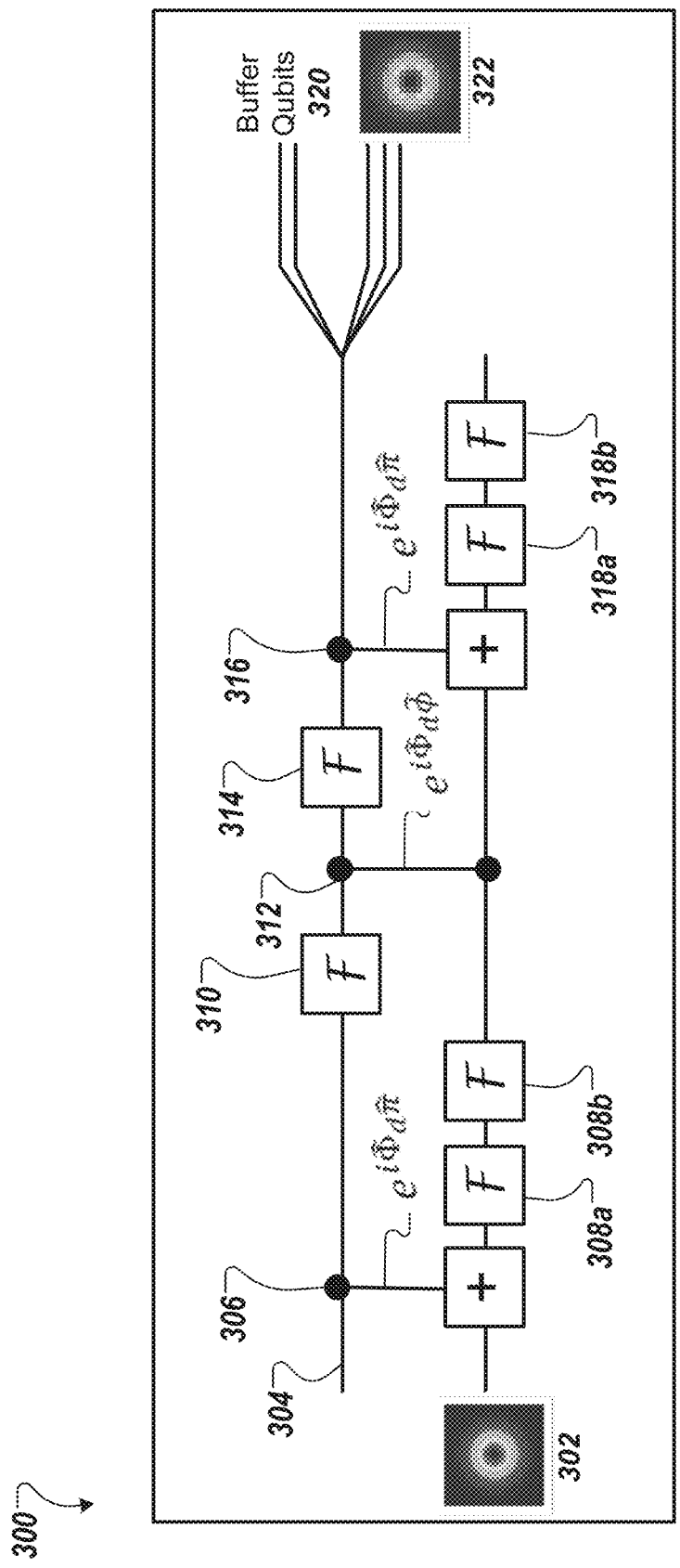
FIG. 3 shows an example hybrid analog-digital encoding operation.

FIG. 3 shows an example hybrid analog-digital encoding operation 300. The example hybrid analog-digital encoding operation 300 is described as being applied to a quantum analog signal 302 and a qudit 304 prepared an initial state, where the qudit represents a $d=2^N$ dimensional quantum register that includes N qubits. However, the example hybrid analog-digital encoding operation 300 could also be applied directly to the quantum analog signal 302 and the N qubits, i.e., the quantum analog signal 302 could also be coupled directly to the N qubits.

During application of the example hybrid analog-digital encoding operation 300, a first unitary transformation 306 is applied to the quantum analog signal 302 and the initial state of the qudit 304 to obtain a first modified quantum analog signal and a first evolved state of the qudit. The first unitary transformation includes a canonical field position operator $\hat{\Phi}_d$ for the qudit 304 and a canonical field momentum operator $\hat{\pi}$ for the quantum analog signal 302. That is, the first unitary transformation is given by $U=e^{i\hat{\Phi}_d\hat{\pi}}$.

Since the qudit represents a $d=2^N$ dimensional quantum register represented by N qubits, application of the first unitary transformation 306 represents an evolution under multiple one-to-one interactions between each of the N qubits and the stationary quantum analog signal 302. That is, the first unitary transformation 306 can represent a total evolution under each of the one-to-one interactions, e.g., a product of individual unitary transformations.

Two quantum Fourier transformations 308a, 308b are then sequentially applied to the first modified quantum analog signal to obtain a second modified quantum analog signal. As described above with reference to FIG. 2, in practical implementations sequential application of two quantum Fourier transforms to a quantum analog signal can be achieved through application of a pi pulse to the analog quantum signal.

A quantum Fourier transformation 310 is applied to the first evolved state of the qudit to obtain a second evolved state of the qudit. A second unitary transformation 312 is applied to the second modified quantum analog signal and the second evolved state of the qudit to obtain a third modified quantum analog signal and a third evolved state of the qudit. The second unitary transformation includes a canonical field position operator $\hat{\Phi}_d$ for the qudit 304 and a canonical field position operator $\hat{\phi}$ for the quantum analog signal 302. That is, the second unitary transformation is given by $U=e^{i\hat{\Phi}_d\hat{\phi}}$.

A quantum Fourier transformation 314 is applied to the third evolved state of the qudit to obtain a fourth evolved state of the qudit.

The first unitary transformation 316 is then applied to the third modified quantum analog signal and the fourth evolved state of the qudit to obtain a fourth modified quantum analog signal and a fifth evolved state of the qudit. The fifth evolved state of the qudit can be provided as a quantum digital encoding 322 of the received quantum analog signal, as described below with reference to step 106 of FIG. 1.

Application of the example hybrid analog-digital encoding operation 300 can also include sequentially applying two quantum Fourier transformations 318a, 318b to the fourth modified quantum analog signal. Application of the two quantum Fourier transformations 318a, 318b is not essential for the encoding process 100, however the two quantum Fourier transformations 318a, 318b must be included in the example hybrid analog-digital encoding operation 300 if the encoding operation is to be a swap operation, i.e., if the example hybrid analog-digital encoding operation 300 is to be a reversible operation.

Returning to FIG. 1, the system provides the qudit in the evolved state as a quantum digital encoding of the received quantum analog signal (step 106). Alternatively or in addition, the system can store the quantum digital encoding of the received quantum analog signal in quantum memory.

In some implementations the system can discard one or more of the N qubits to reduce the resolution of the quantum digital encoding of the received quantum analog signal when providing the qudit in the fifth evolved state as the quantum digital encoding of the received quantum analog signal. This process is illustrated in FIG. 3, where a first number of the N qubits represented by the qudit 304 are provided as the quantum digital encoding 322 of the quantum analog signal 303, and a second number of the N qubits represented by the qudit 304 are buffer qubits 320 and are discarded.

The example process 100 can be repeated to generating multiple quantum digital encodings of respective quantum analog signals. For example, at step 102 the system can receive multiple quantum analog signals where each of the multiple quantum analog signals includes a respective quantum mode of a same quantum field, e.g., where the respective quantum modes of the same quantum field form a basis, and a respective quantum mode amplitude sampled from an interval of the quantum field. In some implementations the multiple quantum analog signals can include quantum analog signals that include a same quantum mode and respective quantum mode amplitudes sampled from different intervals of the quantum field, e.g., where the different sampling intervals of the quantum field are selected based on a Nyquist-Shannon sampling rate.

The system can then apply the hybrid analog-digital encoding operation to each of the multiple quantum analog signals and a qudit in an initial state to obtain multiple qudits in respective evolved states as a quantum digital encoding of the multiple quantum analog signals. In this example, the provided quantum digital encodings of the received multiple quantum analog signals can form a quantum digital encoding of the quantum field.

In some implementations the system can sequentially sample and apply the hybrid analog-digital encoding operation to each of the multiple quantum analog signals. In these implementations the system can apply a hold operation to the analog quantum modes in memory during application of each hybrid analog-digital encoding operation.

Figure 4:
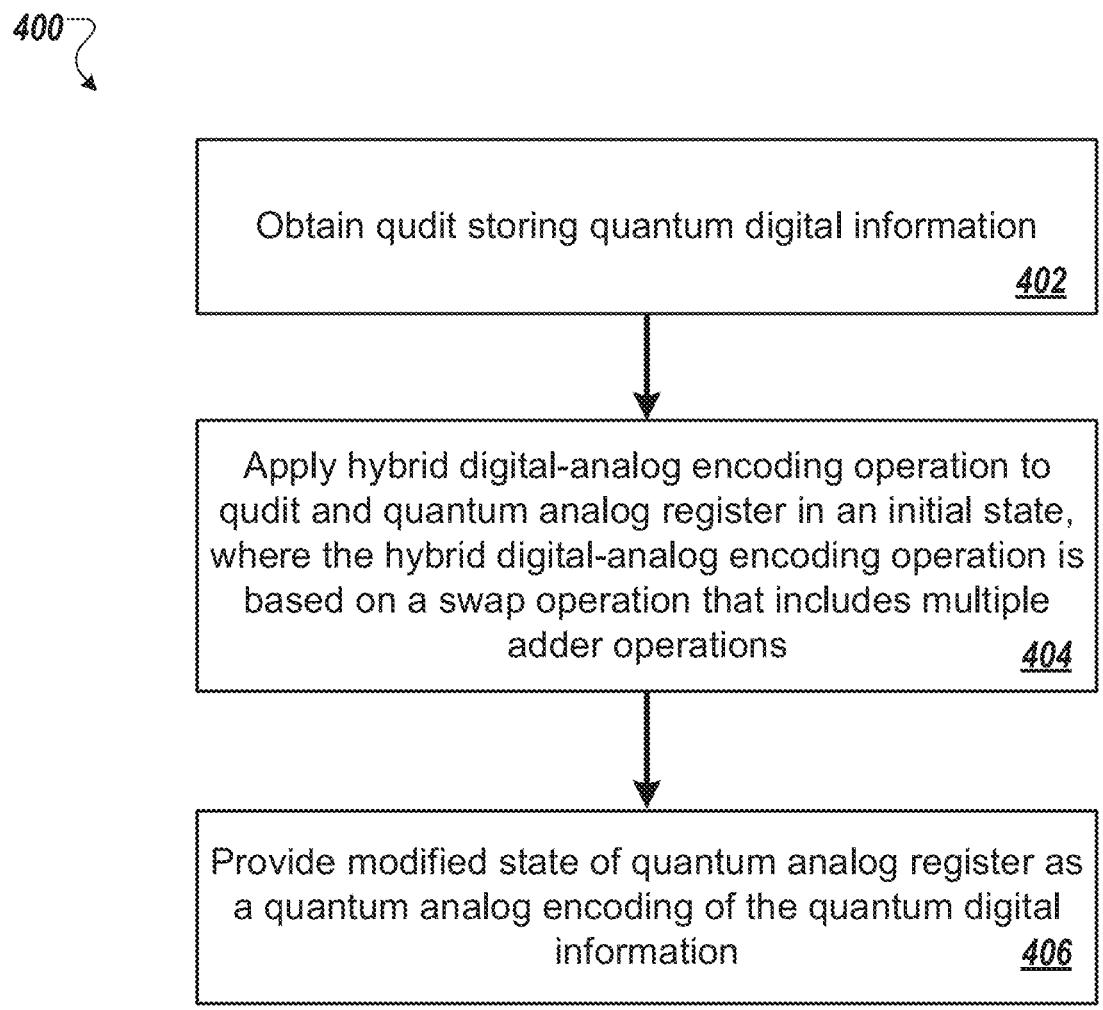
FIG. 4 is a flow diagram of an example process for generating a quantum analog encoding of quantum digital information stored in a qudit.

FIG. 4 is a flow diagram of an example process 400 for generating a quantum analog encoding of quantum digital information stored in a qudit. For convenience, the process 400 will be described as being performed by a system of one or more classical and quantum computing devices located in one or more locations.

The system obtains a qudit that stores quantum digital information (step 402). The qudit includes a $d=2^N$ dimensional quantum register represented by N qubits. In some implementations N can be selected based on a predetermined target encoding precision. For example, in some cases the N qubits can include additional qubits, i.e., qubits that do not store the quantum digital information that is to be encoded as a quantum analog signal, to increase the resolution of the quantum analog encoding of the quantum digital information (to give more range in signal phase space, as well as finer-grained precision/sharpness, i.e. a low fine-grained precision state would seem blurry. By tuning the dimension of the system, this range in phase space can be tuned. Phase space is the space of position and momentum of each signal, depicted as input and output 302 and 322 in FIG. 3).

The system applies a hybrid digital-analog encoding operation to the qudit and a quantum analog register in an initial state to obtain a modified state of the quantum analog register (step 404). The initial state of the quantum analog register can include one or more quantum modes, as described above with reference to FIG. 1. In some implementations the initial state can be a vacuum state or a thermal state, however any state of known range in amplitude and momentum could be used. The use of states with unknown ranges in amplitude and momentum could incur some dithering/aliasing effects, similar to classical under sampling effects. Therefore, if an initial state with amplitude and momentum outside of a known range is used, a non-negligible probability of error may need to be tolerated.

The hybrid digital-analog encoding operation is based on the swap operation described above with reference to FIGS. 1 and 2, and for brevity is not described again. In addition, application of the hybrid digital-analog encoding operation is the same as a reverse application of the hybrid analog-digital encoding operation (including quantum Fourier transformations 318a, 318b) described above with reference to FIGS. 1 and 3, since the example hybrid analog-digital encoding operation illustrated in FIG. 3 is a swap operation and therefore reversible.

Therefore, applying the hybrid digital-analog swap operation to the qudit and the quantum analog register in the initial state includes: sequentially applying the Fourier transformations 318a, 318b of FIG. 3 (or a pi pulse as described above)

to the quantum analog register 302 in the initial state to obtain a first modified state of the quantum analog register. The first unitary transformation 316 is then applied to the first modified state of the quantum analog register and the qudit 304 to obtain a second modified state of the quantum analog register and a first evolved state of the qudit. The Fourier transformation 314 is then applied to the first evolved state of the qudit to obtain a second evolved state of the qudit. The second unitary transformation 312 is then applied to the second modified state of the quantum analog register and the second evolved state of the qudit to obtain a third modified state of the quantum analog register and a third evolved state of the qudit. The Fourier transformation 310 is then applied to the third evolved state of the qudit to obtain a fourth evolved state of the qudit. The Fourier transformations 308a, 308b (or a pi pulse as described above) are then sequentially applied to the third modified state of the quantum analog register to obtain a fourth modified state of the quantum analog register. The first unitary transformation 306 is then applied to the fourth modified state of the quantum analog register and the fourth evolved state of the qudit to obtain a fifth modified state of the quantum analog register. The fifth modified state of the quantum analog register is then provided as a quantum analog encoding of the quantum digital information.

The example process 400 can be repeated to generating multiple quantum analog encodings of respective quantum digital information stored in multiple qudits. For example, at step 402 the system can receive multiple qudits, where each qudit stores respective quantum digital information. The system can then apply the hybrid digital-analog swap operation to each qudit and a quantum analog register in an initial state to obtain multiple modified states of quantum analog registers as a quantum analog encoding of the quantum digital information. In some implementations the states of the quantum analog registers can be combined to produce a quantum field that encodes the information stored in the multiple qudits. For example, the quantum field can interact with the quantum analog registers (analog memory quantum modes) in a similar way to that described above with reference to FIG. 1—through swapping interactions of the form $$\hat{U}_{jk} = e^{i\frac{\pi}{2}\left(\hat{a}_j^\dagger \hat{b}_k + \hat{a}_j \hat{b}_k^\dagger\right)}$$

where $\hat{a}_j$ represents the annihilation operator of memory quantum mode j and $\hat{b}_k$ represents the annihilation operator of smeared observable subsystem k (window of quantum field). An example of a set of smeared observable subsystems is: $\hat{\Phi}_j \equiv \int dx \lambda_j(x) \hat{\Phi}(x)$ where $\lambda_j$ represents $L^2$-normalized window functions and $\hat{\Phi}_{(x)}$ represents the quantum field amplitude at point x. The canonical conjugate of these amplitude observables are $\hat{\pi}_j \equiv \int dx \lambda_j(x) \hat{\Pi}(x)$ with the same normalized window function, and $\hat{\Pi}(x)$ represents the quantum field canonical conjugate to the amplitude at point x. The annihilation operators are defined as $$\hat{b}_j = \frac{1}{\sqrt{2}}(\hat{\Phi}_j + i\hat{\pi}_j)$$

and the corresponding creation operator is the Hermitian conjugate.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" can include, but is not limited to, quantum computers, quantum communication systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that can be suitably approximated as a two-level system in the corresponding context. Such quantum systems can include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that can transmit quantum data using quantum systems, e.g. qubits. Generally, a digital data communication network cannot transmit quantum data, however a quantum data communication network can transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer can receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that can include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for storing a quantum analog signal, the method comprising:
   applying a hybrid analog-digital encoding operation to the quantum analog signal and a qudit in an initial state to obtain an evolved state of the qudit, wherein the hybrid analog-digital encoding operation is based on a swap operation comprising multiple adder operations; and
   storing, in quantum memory, the qudit in the evolved state as a quantum digital encoding of the quantum analog signal.

2. The method of claim 1, wherein one or more of: the multiple adder operations comprise three adder operations and the swap operation comprises multiple Quantum Fourier transformations.

3. The method of claim 1, wherein the qudit in the evolved state stores quantum information included in the quantum analog signal.

4. The method of claim 1, wherein the swap operation comprises:
   a first adder operation applied to a first signal and a second signal;
   two sequential Fourier transformations applied to the second signal;
   a second adder operation applied to the first signal and the second signal;
   two sequential Fourier transformations applied to the first signal;
   a third adder operation applied to the first signal and the second signal; and
   two sequential Fourier transformations applied to the second signal.

5. The method of claim 4, wherein the first signal comprises a first quantum analog signal, the second signal comprises a second quantum analog signal, and the swap operation comprises an analog swap operation that swaps information stored in the first quantum analog signal and the second quantum analog signal.

6. The method of claim 5, wherein:
   the first adder operation and the third adder operation represent a unitary transformation comprising a canonical field position operator for the first quantum analog signal and a canonical field momentum operator for the second quantum analog signal; and
   the second adder operation represents a unitary transformation comprising a canonical field momentum operator for the first quantum analog signal and a canonical field position operator for the second quantum analog signal.

7. The method of claim 4, wherein the first signal comprises a first quantum digital signal, the second signal comprises a second quantum digital signal, and the swap operation comprises a digital swap operation that swaps information stored in the first quantum digital signal and the second quantum digital signal.

8. The method of claim 7, wherein the first adder operation, the second adder operation and the third adder operation represent a unitary transformation comprising a first qudit clock operator generator for the first quantum digital signal and a second qudit clock operator generator for the second quantum digital signal.

9. The method of claim 1, wherein the hybrid analog-digital encoding operation comprises:
   a first unitary transformation comprising a canonical field momentum operator and a qudit field operator;
   multiple Fourier transformations; and
   a second unitary transformation comprising a canonical field position operator and the qudit field operator.

10. The method of claim 9, wherein applying the hybrid analog-digital encoding operation to the quantum analog signal and a qudit in an initial state, comprises:
    applying the first unitary transformation to the quantum analog signal and the initial state of the qudit to obtain a first modified quantum analog signal and a first evolved state of the qudit;
    sequentially applying two Fourier transformations to the first modified quantum analog signal to obtain a second modified quantum analog signal;
    applying a Fourier transformation to the first evolved state of the qudit to obtain a second evolved state of the qudit;
    applying the second unitary transformation to the second modified quantum analog signal and the second evolved state of the qudit to obtain a third modified quantum analog signal and a third evolved state of the qudit;
    applying a Fourier transformation to the third evolved state of the qudit to obtain a fourth evolved state of the qudit; and
    applying the first unitary transformation to the third modified quantum analog signal and the fourth evolved state of the qudit to obtain a fifth evolved state of the qudit, wherein the qudit in the fifth evolved state comprises the quantum digital encoding of the quantum analog signal.

11. The method of claim 10, wherein applying the first unitary transformation to the third modified quantum analog signal and the fourth evolved state of the qudit produces a fourth modified quantum analog signal, and wherein the method further comprises sequentially applying two Fourier transformations to the fourth modified quantum analog signal.

12. The method of claim 10, wherein the qudit comprises a $d=^N$ dimensional quantum register represented by N qubits, wherein N is selected based on a predetermined target encoding precision, and wherein applying the first unitary transformation or second unitary transformation to respective states of the qudit comprises applying corresponding qubit transformations to respective states of the N qubits.

13. The method of claim 12, wherein the qudit field operator is given by a linear combination of qudit clock operator generators and identity operators, and wherein i) the qudit clock operator generators are given by $$\hat{J}_{d=2^N} = \sum_{n=1}^{N} 2^{n-2}\left(\hat{I}_2^{(n)} - Z_2^{(n)}\right)$$

where $\hat{I}_2^{(n)}$ represents a 2×2 identity operator acting on qubit n and $Z_2^n$ represents a Pauli Z operator acting on qubit n, and ii) the qudit field operator is given by $$\Phi_d = \frac{(b-a)}{(d-1)}\hat{J}_d + a\hat{I}_d$$

where $\hat{I}_d$ represents a d×d identity operator and [a, b] represents a quantum analog sampling interval.

14. The method of claim 1, wherein the quantum analog signal comprises a quantum mode of a quantum field and a quantum mode amplitude sampled from an interval of space, frequency, or a general window function profile of the quantum field.

15. The method of claim 14, further comprising:
sampling the quantum mode and quantum mode amplitude of the quantum field using a resonator coupled to the quantum field; and
storing the sampled quantum mode and quantum mode amplitude in an analog register, optionally wherein the resonator coupled to the quantum field comprises the analog register.

16. The method of claim 15, wherein sampling the quantum mode and quantum mode amplitude of the quantum field using a resonator coupled to the quantum field comprises swapping quantum information from the quantum analog signal onto a quantum mode through application of an analog swap operation to the quantum analog signal and the quantum mode, wherein application of the analog swap operation to the quantum analog signal and the quantum mode comprises evolving the quantum analog signal and the quantum mode under photon exchange interaction.

17. The method of claim 14, wherein the quantum mode amplitude comprises an average field amplitude value determined according to a predetermined window function and a quantum field operator corresponding to the quantum field, wherein the predetermined window function comprises a wavelet.

18. The method of claim 1, further comprising:
receiving multiple quantum analog signals, wherein each of the multiple quantum analog signals comprises a respective quantum mode of a same quantum field and a respective quantum mode amplitude sampled from an interval of the quantum field;
applying, for each received quantum analog signal, the hybrid analog-digital encoding operation to the quantum analog signal and a qudit in an initial state; and
storing, in the quantum memory and for each received quantum analog signal, a respective qudit in an evolved state as a quantum digital encoding of the quantum analog signal,
wherein i) the quantum digital encodings of the received multiple quantum analog signals comprise a quantum digital encoding of the quantum field, ii) the respective quantum modes of the same quantum field form a basis, and iii) the multiple quantum analog signals comprise quantum analog signals comprising a same quantum mode and respective quantum mode amplitudes sampled from different intervals of the quantum field.

19. The method of claim 18, further comprising:
sequentially sampling and applying the hybrid analog-digital encoding operation to each quantum analog signal, wherein a hold operation is applied to analog quantum modes in memory during application of each hybrid analog-digital encoding operation.

20. An apparatus comprising:
quantum computing hardware; and
classical computing hardware;
wherein the apparatus is configured to perform operations comprising:
applying a hybrid analog-digital encoding operation to a quantum analog signal and a qudit in an initial state to obtain an evolved state of the qudit, wherein the hybrid analog-digital encoding operation is based on a swap operation comprising multiple adder operations; and
storing, in quantum memory, the qudit in the evolved state as a quantum digital encoding of the quantum analog signal.

* * * * *